United States Patent [19]

Von Criegern et al.

[11] Patent Number: 4,851,672
[45] Date of Patent: Jul. 25, 1989

[54] SPECIMEN MOUNT FOR SECONDARY ION MASS SPECTROMETRY AND OTHER SENSITIVE PARTICLE BEAM ANALYSIS METHODS AND METHOD FOR THE OPERATION THEREOF

[75] Inventors: Rolf Von Criegern, Geretsried; Ingo Weitzel, Taufkirchen, both of Fed. Rep. of Germany

[73] Assignee: Siemens Aktiengesellschaft, Berlin and Munich, Fed. Rep. of Germany

[21] Appl. No.: 642,396

[22] Filed: Aug. 20, 1984

[30] Foreign Application Priority Data

Sep. 30, 1983 [DE] Fed. Rep. of Germany ....... 3335581

[51] Int. Cl.[4] ..................... G01N 23/00; G21K 5/10
[52] U.S. Cl. ......................... 250/307; 250/442.1; 250/492.3
[58] Field of Search ........... 250/306, 307, 310, 440.1, 250/442.1, 492.2

[56] References Cited

U.S. PATENT DOCUMENTS

| | | | |
|---|---|---|---|
| 3,086,112 | 4/1963 | Riecke | 250/442.1 |
| 3,629,577 | 12/1971 | Weber et al. | 250/442.1 |
| 3,911,282 | 10/1975 | Bergan | 250/442.1 |
| 4,405,864 | 9/1983 | del Rio | 250/442.1 |
| 4,465,935 | 8/1984 | von Criegern et al. | 250/440.1 |

FOREIGN PATENT DOCUMENTS 0070351 2/1982 European Pat. Off. .

*Primary Examiner*—Bruce C. Anderson
*Attorney, Agent, or Firm*—Hill, Van Santen, Steadman & Simpson

[57] ABSTRACT

A specimen mount for secondary ion mass spectrometry, as well for other sensitive particle beam analysis methods, has a rotatable support element to which at least one carrier is secured, a specimen being affixed to a free end of the carrier. The dimensions of the carrier in directions perpendicular to the propagation direction of the ion or particle beam are smaller than the dimensions of the specimen mounted thereon, so that only the specimen, and no surrounding environment, is in the beam path. The rotatable element is driven so as to move one or more of the carriers with the specimens mounted thereon through the beam path.

11 Claims, 2 Drawing Sheets

SPECIMEN MOUNT FOR SECONDARY ION MASS SPECTROMETRY AND OTHER SENSITIVE PARTICLE BEAM ANALYSIS METHODS AND METHOD FOR THE OPERATION THEREOF

BACKGROUND OF THE INVENTION

1. Field of the Invention

The present invention relates to a specimen mount for use in secondary ion mass spectrometry and other sensitive particle beam analysis methods, and a method for operating such a specimen mount.

2. Description of the Prior Art

Higher and higher demands are being made on the capability of secondary ion mass spectrometry (SIMS), particularly in the field of semiconductor development. For many applications, for example, the concentration span which can be registered in a depth profile ("dynamic range") should be expanded from above $10^{21}$ atoms/cm$^3$ to below $10^{14}$ atoms/cm$^3$, and the documentation boundaries for dopant-active elements of interest, for example boron and antimony, should be lowered as far as possible.

A problem in the art is the generation of disruptive signals which result from the environment of the sputter crater which is generated during secondary ion mass spectrometry and other particle beam analysis methods. Particularly in secondary ion mass spectrometry, current performance limits with respect to the above two criteria are defined by disruptive scatter components deriving from the rim of the sputter crater which arises during measurement and from the environment thereof. It is extremely difficult to reduce such disruptive signal contributions by further processing measures, however, a considerable improvement can be achieved without significant outlay by suitable specimen preparation.

A specimen mount for secondary ion mass spectrometry is described in European patent application EP No. 0 070 351 A wherein the specimen to be analyzed is bombarded with an ion or particle beam, and the specimen is completely disposed, without surrounding environment, in the inside of the region on which the ion or particle beam is incident. Disruptive influences of the crater rim and surrounding environment are largely avoided by use of this specimen mount.

SUMMARY OF THE INVENTION

It is an object of the present invention to provide a specimen mount for secondary ion mass spectrometry and other sensitive particle beam analysis methods which has a simplified structure and wherein elimination of the influence of the specimen environment is released to a higher degree than in conventional specimen mounts.

It is a further object of the present invention to provide a method for operating such a specimen mount.

The above object are inventively achieved in a specimen mount having a central rotatable element to which at least one carrier means is attached at the periphery thereof. The carrier means has a specimen affixed to a free end thereof, and has dimensions in directions perpendicular to the direction of propagation of the ion or particle beam which are less than the dimensions of the specimen mounted thereon, so that the specimen is disposed completely within the beam path by itself, with no surrounding mount environment.

The specimens affixed to the mount disclosed and claimed herein are prepared of a size so as to lie completely within the region swept by the ion or particle beam. As stated above, the specimens are mounted and analyzed completely free of mount environment in the direction of the ion or particle beam. Disruptive crater rim and other environment influences are thus largely eliminated.

Comparative measurements have shown that the dynamic range of the depth profiles for specimens analyzed using the specimen mount disclosed herein can be expanded by at least one decade over specimens analyzed using conventional specimen mounts. Moreover, the documentation limits for various elements can be noticeably lowered as well for specimens analyzed by secondary ion mass spectrometry utilizing the mount disclosed herein.

The use of the specimen mount disclosed herein requires only a slight outlay for manufacture and achieves improved results for routinely executed measurements. Repetitive measurements due to ambiguous results can be eliminated by the use of this mount.

When the mount is used to hold a specimen or specimens for ion beam analysis, the cusp points of the ion beam motion when scanning the specimen and thus the "crater rim" lie beyond the physical limits of the specimen. If a neutral particle beam is utilized, the edge of the region on which the neutral particle beam is incident also lies beyond the boundaries of the specimen. Signal contributions from the environment of the specimen are thus completely eliminated and the specimen appears to be mounted completely carrier-free in the direction of ion or particle beam propagation because the needle-shaped specimen carrie is completely hidden by the specimen. Therefore, no particles are incident on any portion of the specimen mount, because no portion of the specimen mount is within the environment of the specimen in the beam path.

DESCRIPTION OF THE PREFERRED EMBODIMENTS

In conventional secondary ion mass spectrometry, an ion beam is scanned line-by-line over a specimen and a sputter crater is thereby produced on the specimen. The secondary ions arising as a result of the scan are directed to a mass spectrometer and analyzed. By measuring the signal intensity of the secondary ions of a specific type as a function of time, a so-called depth profile for a particular chemical element is obtained for the specimen under investigation.

A specimen whose elemental composition is to be analyzed by the technique of secondary ion mass spectrometry is bombarded at 1 through 15 keV and 1 nA with an ion beam, for example, $O_2$ at 1 through 15 keV and 1 nA through 10 μA and is thereby slowly eroded in a sputtering process. The atoms and molecule fragments thereby released (sputtered off) from the surface of the specimen are directed to a mass spectrometer insofar as they are electrically charged (secondary ions). The ions are separated therein according to their mass-charge ratio and are detected and counted by means of a multiplier or the like.

In order to achieve uniform erosion of the specimens over the entire area to be analyzed, the ion beam is generally focused on the specimen surface and swept line-by-line across the area. Such a commercially available scanning ion beam apparatus is the a-DIDA of Atomika GmbH, Munich, Germany.

Figure 1:
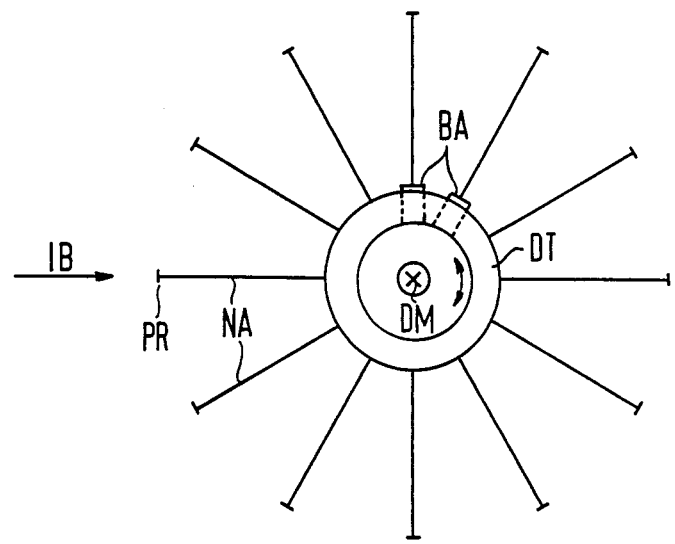
FIG. 1 is a side view of a specimen mount constructed in accordance with the principles of the present invention.

A specimen mount for use in secondary ion mass spectrometry and other particle beam analyzing methods constructed in accordance with the principles of the present invention is shown in FIG. 1. The specimen mount has a rotatable element DT having a plurality of needles NA inserted therein so as to extend radially therefrom. Each of the needles NA is ground perpendicular to its longitudinal axis. A specimen PR in the form of a finely sawn or cut wafer is affixed by suitable adhesion means to the free end of each needle NA for analysis free of any mount environment. The surface for each specimen PR preferably has a length and width each less than 1 millimeter.

The specimen mount consisting of the rotary element DT with the needles NA inserted therein and the specimens PR affixed to the needles NA is secured to a shaft DM by means of a commercially available ultrahigh vacuum manipulator. By rotating the entire specimen mount around the shaft DM, the individual specimens PR are successively brought into a scanning position in which the ion beam IB is incident on the surface of the specimen PR substantially perpendicularly.

The needles NA have a diameter which is less than the corresponding dimension of the smallest cut specimen PR, such that the specimens PR cover the needles NA relative to the ion beam IB.

The needles NA are preferably as long as possible so that the primary ions of the ion beam IB which are not incident on the surface of the closest specimen PR will only be incident on another specimen surface further along the direction of ion beam propagation at a substantial distance from this first specimen surface, so that the signals resulting thereby at the subsequent surface do not supply a significant contribution to the measuring signals registered in the mass spectrometer. Sewing needles having a diameter of less than 0.6 millimeters and a length of at least 5 millimeters are particularly suited for use as the needles NA, for example. Experiments undertaken with a needle length of 40 millimeters and a needle diameter of 0.4 millimeters have yielded very good results. Shorter needle lengths down to one millimeter may be useful given employment of suitable ion optics for directing the secondary ions into the mass spectrometer.

The needles NA are individually retained in a sleeve BA and may be inserted into the rotatable element DT at an inclination such that the ion beam IB is incident on the surface of the specimen PR exactly perpendicularly. The inclination of the ion beam IB of approximately two degrees relative to the normal of the specimen which exists in the aforementioned Atomika device can thus be compensated.

Figure 2:
FIG. 2 is a perspective view showing a carrier with a specimen mounted thereon in detail as used in the specimen mount shown in FIG. 1.

An individual needle NA with a specimen PR mounted thereon is shown in detail in FIG. 2. The needle NA may be directly inserted into the rotatable element DT or, as mentioned above and as shown in FIG. 2, may be interchangeably retained in a sleeve BA in order to facilitate easier specimen mounting. If a sleeve BA is utilized, it is possible to define the attitude of the needle NA with respect to its rotational angle around its longitudinal axis. The sleeve BA has a flattened segment at its circumference. Two such needles NA secured to the rotary element DT by means of such fastening sleeves BA are shown in FIG. 1. The flattened portion or face of the sleeves BA rests fully adjacent against one interior side of the rotatable element DT. One face of the rotatable element DT may be removable, such as by screws, to facilitate insertion and removal of the sleeves BA carrying the needles NA. The attitude of the needle NA with respect to its rotational angle about its longitudinal axis is thereby defined, and it can thus be guaranteed that the edges of the specimen PR are disposed parallel to the edge of the scanning region of the ion beam IB.

The portion of the rotatable element DT in which the needles NA are inserted is electrically insulated from the shaft DM by at least one insulating piece. Potentials arising at the specimen PR which are to be investigated by means of electrical contact can be achieved in this manner.

The number of needles NA and thus the number of specimen positions in the specimen mount depend both on design factors and on a necessary minimum spacing to a neighboring needle. Given a diameter of, for example, 100 millimeters for the overall "spoked wheel" consisting of the rotary element DT and the needles NA secured thereto, a division of this "spoked wheel" in steps of 30 degrees is suitable.

The rotary element DT may be dimensioned such that second "spoked wheel" can be secured thereto parallel to the first "spoked wheel" wherein the number of specimen positions can be doubled.

Figure 3:
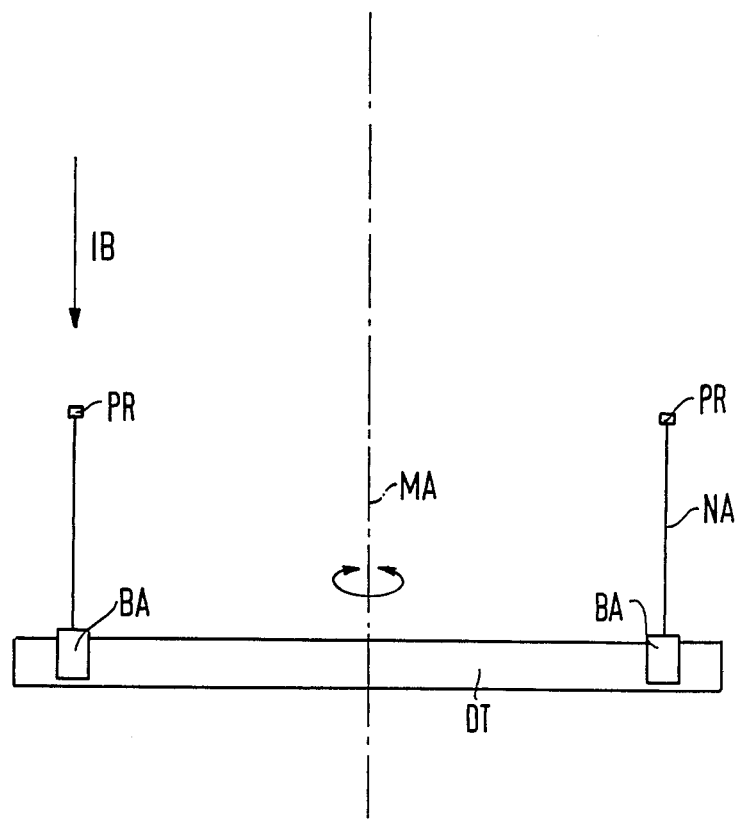
FIG. 3 is a side elevation view of a second embodiment of a specimen mount constructed in accordance with the principles of the present invention.

A further embodiment of a specimen mount constructed in accordance with the principals of the present invention is shown in FIG. 3. The statements concerning the general operation and advantages of the embodiment shown in FIGS. 1 and 2 apply to the embodiment of FIG. 3 as well. In the embodiment of FIG. 3, the ion beam IB is incident on the specimens PR parallel to the shaft MA (shown schematically) about which the rotatable element DT rotates. The needles NA are secured at the edges of the rotatable element DT by the sleeves BA such that the flattened faces of the sleeves BA press firmly against the outer edge of the rotatable element DT. By this arrangement, the ion beam IB is again incident perpendicularly on the surfaces of the specimens PR.

Additional electrodes may also be provided for use in combination with the specimen mount in order to arrest scatter particles such as unwanted ions and electrons. Additionally or alternatively, slight scatter components deriving from the rotatable element DT or the needles NA may be maintained as low as possible by suitable selection of the materials comprising those elements and/or by selection of suitable coatings for these elements.

Other modifications and changes may be suggested by those skilled in the art, however, it is the intention of the inventors to embody within the patent warranted hereon all changes and modifications as reasonably and properly come within the scope of their contribution to the art.

We claim as our invention:

1. A specimen mount for secondary ion mass spectrometry and other sensitive particle beam analysis systems wherein a specimen to be analyzed is bombarded with an ion or particle beam comprising:

a rotatable element;

at least one carrier means secured to a periphery of said rotatable element and having a free end to which a specimen is affixed, the dimensions of said carrier means in directions perpendicular to the direction of propagation of said ion or particle beam being less than the dimensions of the specimen affixed thereto such that said specimen is completely disposed inside the path of said beam with no mount environment exposed to said beam, said rotatable element with said carrier means thereon being rotatable such that said specimen passes through said beam path.

2. A specimen mount as claimed in claim 1 wherein at least one of said carrier means is radially secured to said rotatable element.

3. A specimen mount as claimed in claim 1 wherein said carrier means is a needle having a diameter less than 0.6 millimeters and a length of at least 1 millimeter.

4. A specimen mount as claimed in claim 1 wherein said carrier means is secured to said rotatable element at an angle of inclination such that said ion or particle beam is perpendicularly incident on a surface of said specimen.

5. A specimen mount as claimed in claim 1 further comprising a means for interchangeably securing said carrier means to said rotatable element.

6. A specimen mount as claimed in claim 5 wherein said means for interchangeably securing said carrier means to said rotatable element is a sleeve receiving said carrier means, said sleeve being mounted in said rotatable element such that the attitude of said carrier means is defined relative to a rotational axis parallel to the direction of said ion or particle beam.

7. A specimen mount as claimed in claim 1 further comprising a means for electrically insulating said carrier means from said rotatable element.

8. A specimen mount as claimed in claim 1 wherein said rotatable element has a diameter of at least 10 millimeters and has 12 carrier means secured thereto.

9. A specimen mount as claimed in claim 1 comprising at least two carrier means secured to said rotatable element at a spacing of at least 1 millimeter.

10. A specimen mount as claimed in claim 1 wherein said carrier means are secured to said rotatable element such that said carrier means is secured to said rotatable element such that a longitudinal axis of said carrier means is parallel of an axis of rotation of said rotatable element.

11. A method for operating a specimen mount for secondary ion mass spectrometry comprising the steps of:

mounting a plurality of different specimens to be analyzed on respective carrier means secured to the periphery of a rotatable element; and rotating said rotatable element through an ion beam path.

* * * * *